United States Patent [19]

Handte et al.

[11] 4,268,794

[45] May 19, 1981

[54] SELF-ADJUSTING RAMP GENERATOR

[75] Inventors: Herbert Handte, Filderstadt; Friedrich Kollmar, Grafenau, both of Fed. Rep. of Germany

[73] Assignee: Moog GmbH, Böblingen, Fed. Rep. of Germany

[21] Appl. No.: 7,698

[22] Filed: Jan. 30, 1979

[30] Foreign Application Priority Data

Jan. 31, 1978 [DE] Fed. Rep. of Germany ....... 2804145

[51] Int. Cl.³ .......................... H03K 4/08; H03K 6/04
[52] U.S. Cl. ..................................... 328/185; 307/228
[58] Field of Search ................. 328/185, 181; 307/228

[56] References Cited

U.S. PATENT DOCUMENTS

| | | | |
|---|---|---|---|
| 3,373,377 | 3/1968 | Townsend | 307/228 |
| 3,569,735 | 3/1971 | Lavender | 307/228 |
| 3,577,007 | 4/1971 | Cross | 307/228 |
| 3,714,470 | 1/1973 | Goldberg | 307/228 X |
| 3,808,460 | 4/1974 | Mosca | 307/228 |
| 4,071,776 | 1/1978 | Isham | 307/228 |
| 4,131,807 | 12/1978 | Korver | 307/228 |

Primary Examiner—John S. Heyman
Attorney, Agent, or Firm—Sommer & Sommer

[57] ABSTRACT

Apparatus is provided for generating a self-adjusting saw-tooth wave in response to an input signal containing a plurality of successive start pulses separating time intervals of variable length. The apparatus includes an integrator for generating a ramp signal during each time interval, a comparator for comparing the value of the integrator output signal with a predetermined maximum value and for supplying, at the end of each time interval, the difference therebetween as a correction signal to modify the slope of the ramp signal generated during the next subsequent time interval. The slope of the ramp signal is adjusted to accommodate variations in length of successive time intervals so that the peak value of such ramp signals will equal a predetermined maximum value at the end of successive time intervals of equal length.

5 Claims, 3 Drawing Figures

SELF-ADJUSTING RAMP GENERATOR

BACKGROUND OF THE INVENTION

1. Field of the Invention

The present invention relates generally to apparatus for generating a saw-tooth wave form, and more particularly to improved apparatus for generating a slope-adjusted saw-tooth wave for use in association with automatic extrusion apparatus.

2. Description of the Prior Art

In the manufacture of blow-molded bodies and articles, a parison is initially extruded, and thereafter inflated in a blow-mold to the desired shape. When designing the shape of the parison to be extruded, one must consider the strain to which the parison will be subsequently subjected during the blow-mold operation. To this end, parisons are formed to have varying wall thicknesses at different points along their extruded lengths. Known extruders have a pintle movable relative to a die head to create a variable orifice-like annular opening therebetween. Hence, when the pintle is moved further away from the die head, the parison wall thickness will be increased, and vice versa. Apparatus has also been developed to produce desired pintle movement in response to an electrical command signal. For example, an electrohydraulic servoactuator may be used to convert an electrical input command signal in to a corresponding hydraulic signal, which may in turn be used to cause such desired pintle movement.

It is also known to provide an electrical signal in the form of a plurality of superimposed voltage triangles, such as shown in our prior pending application Ser. No. 000,507, filed Jan. 2, 1979, or in U.S. Pat. No. 3,865,528. In effect, the ascending side of one triangle is superimposed on the descending side of another triangle so that the sum of their values will be a constant at any point in time. A potentiometer can be used to tap off an intermediate signal. Hence, a plurality of potentiometers each representing different positions of extruded parison length, can be individually set so as to produce a control signal reflective of the desired parison shape.

In known extrusion apparatus, such as that disclosed in our aforesaid pending U.S. patent application Ser. No. 000,507, the operation of a program is slaved to the position of an extrusion ram. Hence, a matrix representing parison wall thickness as a function of length, is scanned at a rate coupled to the rate at which the ram extrudes material. However, in alternate structure, such as that in which the plastic material is extruded by a continuously rotating screw conveyor, a ramp signal must be independently generated, and then desirably slaved to a system parameter. The object is to scan the parison wall thickness program at a rate proportional to the rate at which material is extruded. Such slaving will insure time synchronization between program sweep and parameter operation.

SUMMARY OF THE INVENTION

The present invention provides an improved ramp generator for producing a self-adjusting saw-tooth wave in response to an input signal containing a plurality of successive "start" pulses separating time intervals of variable length.

The improved ramp generator broadly includes a ramp function generator, such as an integrator, supplied with the input signal and operative to produce an output ramp signal during each time interval; and correction means for varying the slope of the ramp signal produced in any one time interval in response to the length of that particular time interval so that a modified-slope ramp signal will rise to equal a predetermined maximum value at the end of the next successive time interval, if such one and successive time intervals are of equal length.

The correction means may include a comparator circuit arranged to compare the value of the ramp signal with a predetermined maximum value, and to supply the difference therebetween as a correction signal to the ramp function generator. Such correction signal may be stored in a storage circuit during any time interval and may be supplied to a multiplier for amplifying the ramp generator output signal during that time interval. The "start" pulses may be further shaped by one or more differentiators.

Accordingly, one object is to provide an improved apparatus for generating a saw-tooth wave.

Another object is to provide an improved saw-tooth wave generator which adjusts the slope of the ramp signal to compensate for variations in time intervals.

Another object is to provide an improved ramp generator which generates a saw-tooth wave seeking a constant height in each of a plurality of successive time intervals of variable length.

Another object is to provide an improved ramp generator for use in synchronizing the sweep of an extrusion die control program to some system parameter.

There and other objects will become apparent from the foregoing and ongoing specification, the drawings and the appended claims.

DESCRIPTION OF THE PREFERRED EMBODIMENT(S)

Figure 1:
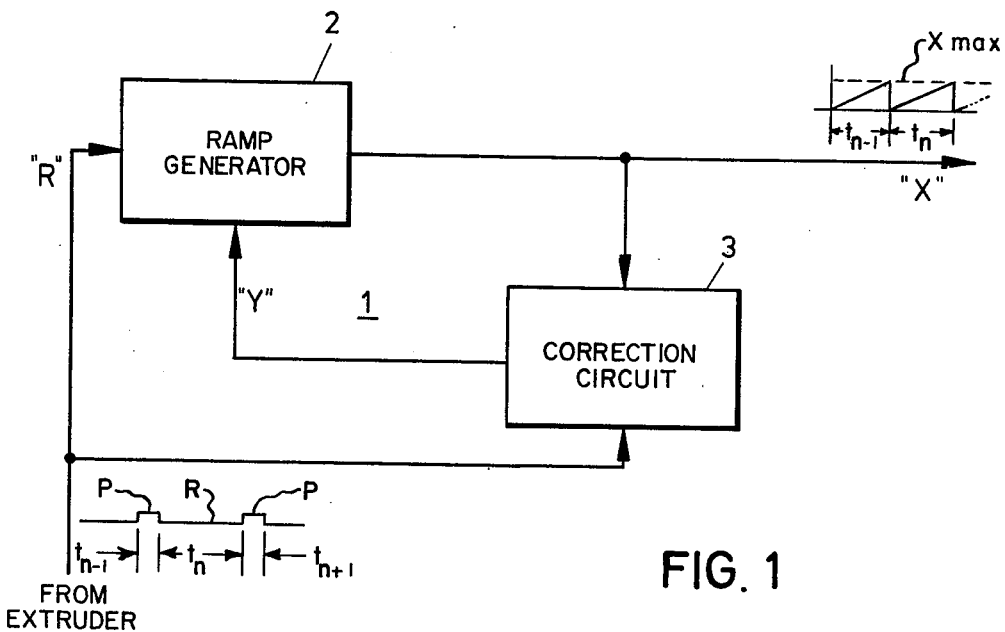
FIG. 1 is a fundamental schematic block diagram of an improved self-adjusting ramp generator.

At the outset, it should be clearly understood that like reference numerals are intended to identify the same elements and/or structure consistently throughout the several drawing figures, as such elements and/or structure may be further described or explained by the entire written specification of which this detailed description is an integral part.

Referring now to the drawings, and more particularly to FIG. 1 thereof, the invention broadly provides improved ramp generator, of which the presently preferred embodiment is generally indicated at 1, for generating a self-adjusting saw-tooth wave in response to an input signal containing a plurality of successive start pulses separating time intervals of variable length.

In FIG. 1, a fundamental schematic of the improved apparatus 1 is shown as including a ramp function generator 2 supplied with an inlet signal R from an extruder, or some other source. Ramp function generator 2 supplies a saw-tooth wave form as an output signal X. A correction circuit 3 is supplied with ramp function generator output signal X, and with inlet signal R, (or some signal derived therefrom), and supplies an output correction signal Y to the ramp function generator. In FIG. 1, the circuit inlet signal R is depicted as containing a plurality of successive start pulses P separating time intervals $t_n$ of variable length. The circuit output signal X is shown as being a saw-tooth wave form in which a linear ramp signal rises from zero to a predetermined maximum value during each time interval between successive pulses. If the slope of the ramp function generated during each time interval is constant, then the value of the output signal X will be greatest at the end of each time interval, and will depend upon the length of the time interval.

The improved circuit 1 is self-adjusting in the sense that the correction signal Y supplied to the ramp function generator 2 modifies the slope of the ramp signal generated during the next successive time interval so that the value of the ramp signal will rise to equal the predetermined maximum value at the end of the next successive time interval, if the next successive time interval is of equal length to the preceding time interval. Hence, the improved circuit accommodates variations in the length of the time intervals by adjusting the slope of the ramp signal such that the ramp signal will thereafter rise to a predetermined maximum value at the end of successive time intervals of equal length. Generally, only one transitional time interval is required to vary the ramp signal slope to accommodate a change in the length of the time interval.

Figure 2:
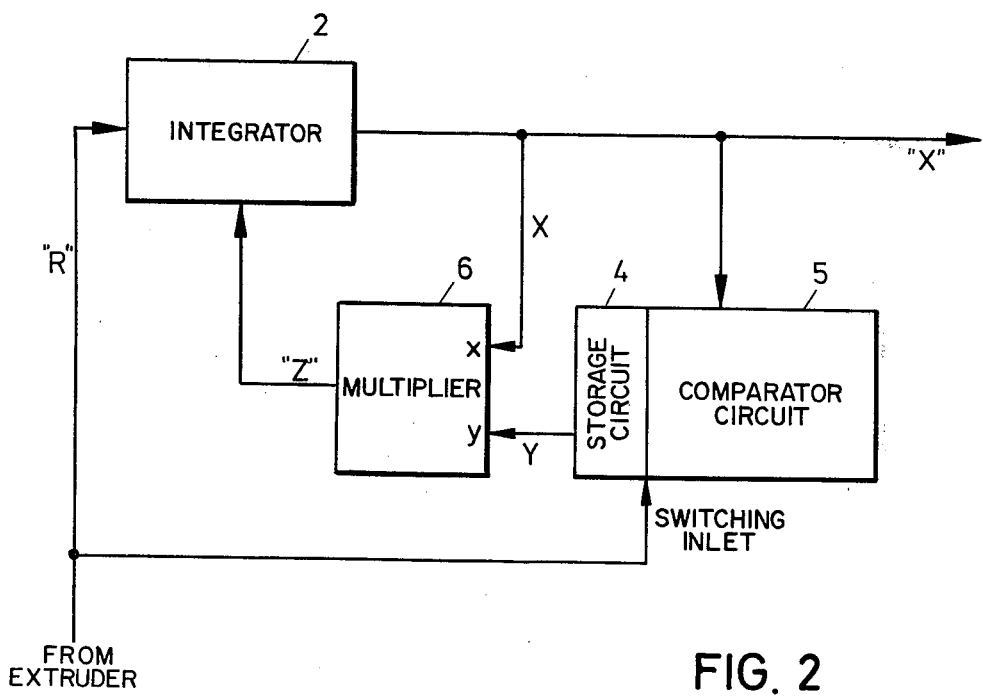
FIG. 2 is a schematic block diagram of a modified self-adjusting ramp generator.

The presently preferred embodiment of the improved apparatus is schematically illustrated in FIG. 2. There, the ramp function generator 2 is shown as being an integrator, and the correction circuit 3 is shown as including a storage circuit 4 and a comparator circuit 5. The inlet signal R from other structure, such as an extruder, is supplied as one input to the integrator. The integrator produces an output signal X, which is supplied to comparator 5 and to a multiplier 6. The inlet signal R, or a signal derived therefrom, is supplied to a switching inlet at the interface between the comparator and storage circuits, and functions to selectively transfer data from the comparator circuit to the storage circuit at the end of each time interval. The storage circuit supplies a correction signal Y to the multiplier, which supplies the product Z of signals X and Y, as another input signal to the integrator.

In other words, multiplier output signal Z is related to its input signals X and Y according to the following equation:

$$Z = X \cdot Y \quad (1)$$

At the beginning of each time interval, a ramp signal is formed at the output of the integrator, and this ramp signal increases linearly as a function of time. The correction signal Y is constant during any particular time interval, and is adjusted between time intervals. Since the value of Y is constant during any time interval, signal X is directly proportional to signal Z according to the following equation:

$$X = Z/Y \quad (2)$$

During any time interval $t_a$ the value of Z will rise to its peak value $Z_{max}$ according to a linear function:

$$Z_{max} = K \cdot t_a \quad (3)$$

where K is a constant representing the slope of the ramp function during that time interval.

Since signals X and Z are directly proportional, signal X will reach its maximum or peak value $X_{max}$ at the same time that signal Z reaches its maximum value, or:

$$X_{max} = \frac{Z_{max}}{Y} = \frac{K \cdot t_a}{Y} \quad (4)$$

From equation 4, it may be seen that $X_{max}$ is inversely related to the value of correction signal Y. Hence, if it is desired that $X_{max}$ be a constant predetermined maximum value, then the value of Y will have to be increased if the time interval $t_a$ increases. Conversely, if the time interval is less, then correction signal Y must be correspondingly decreased for $X_{max}$ to remain a constant.

Figure 3:
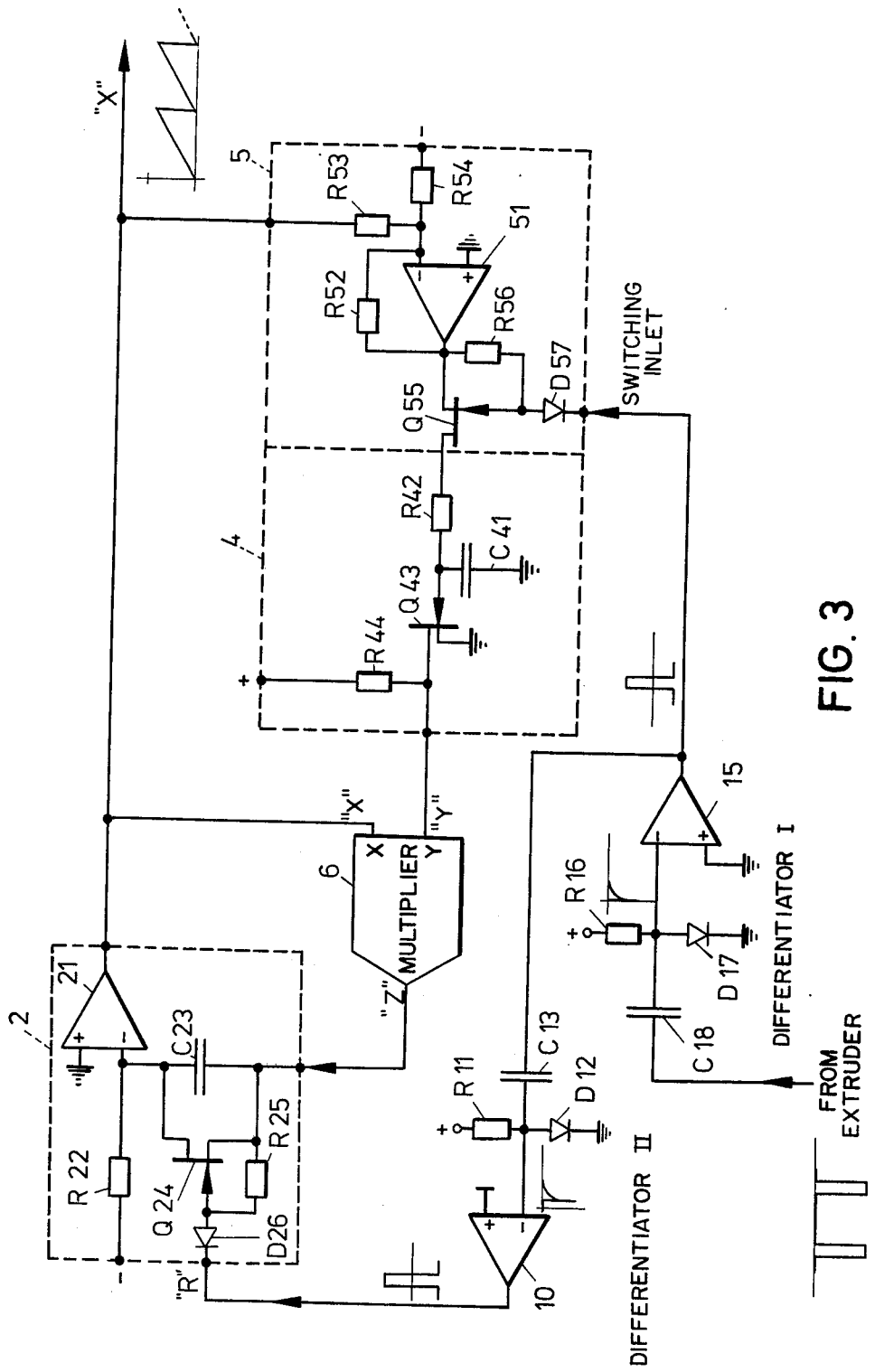
FIG. 3 is an electrical schematic of the block diagram shown in FIG. 2, and further showing two differentiators for shaping the pulses in the inlet signal.

FIG. 3 illustrates an electrical schematic of the presently preferred embodiment depicted in FIG. 2, except that differentiators I and II are employed to modify the shape of the inlet signal supplied from the extruder.

In FIG. 3, integrator 2 is shown as including an operational amplifier 21, having its non-inverting inlet grounded. The inverting inlet of amplifier 21 is connected via resistor R22 with a negative voltage source. A capacitor C23 is connected to a junction point between amplifier 21 and resistor R22. Capacitor C23 is bridged by a transistor switch Q24, the source and gate electrodes of which are connected via resistor R25. A diode D26 is positioned in series with the gate of transistor switch Q24, ahead of its junction point with resistor R25. Switch Q24 is normally open during each time interval, and is selectively closed by the pulses in inlet signal R to shunt and quickly discharge capacitor C23.

The storage circuit 4 includes an RC circuit containing capacitor C41 and resistor R42. The junction point between capacitor C41 and resistor R42 is connected to the gate electrode of a self-conducting field effect transistor Q43, which acts as a buffer. The source electrode of transistor Q43 is grounded, and its drain electrode is connected via resistor R44 with a positive voltage source.

The comparator circuit 5 includes an operational amplifier 51, having its non-inverting inlet grounded. The inverting inlet and outlet of amplifier 51 are connected via resistor R52. The inverting inlet of amplifier 51 is connected to the central tap of a voltage divider including series-connected resistors R53 and R54. The free terminal of resistor R54 is connected to a negative voltage source, and the free terminal of resistor R53 is connected to the outlet of integrator 2. The voltage divider is designed such that a potential of zero volts exists at the inverting inlet of amplifier 51 when the ramp output voltage has reached a predetermined maximum value, say +10 volts.

Switch means, such as field effect transistor switch Q55, are interposed between the comparator and storage circuits, and specifically between the output of amplifier 55 and the input of resistor R42. The source and gate electrodes of transistor switch Q55 are connected via a resistor R56, and a diode D57 is shown provided between the switching inlet and the junction point between resistor R56 and the source electrode of transistor Q55.

The output of the storage circuit 4 is a correction signal Y, which is supplied to multiplier inlet y. The multiplier has another inlet x, connected to the output of integrator 2. The output of the multiplier is connected to integrator capacitor C23.

Differentiator I is shown as including capacitor C18, diode D17, resistor R16, and operational amplifier 15. The input signal supplied by the extruder is supplied to the inverting inlet of amplifier 15 via capacitor C18. The non-inverting inlet of amplifier 15 is grounded. A positive voltage source is connected via resistor R16 to the junction point between capacitor C18 and amplifier 15. This junction point is also connected to ground via diode D17. The output signal of amplifier 15 is supplied to the free terminal of diode D57 for use in operating switch Q55, and is also supplied as an input signal to differentiator II.

Differentiator II receives the output from amplifier 15 at the inverting inlet of operational amplifier 10 through capacitor C13. The junction point between amplifier 10 and capacitor C13 is connected to a positive voltage source through resistor R11, and to ground through diode D12. The output signal from amplifier 10 is supplied to integrator switch Q24 through diode D26.

Differentiators I and II function to shape the pulses contained in the inlet signal supplied by the extruder. Differentiator I provides a differentiated output signal having pulses of narrowed width, for use in selectively closing switch Q55 for a discrete time. Differentiator II, which is also supplied with the differentiated signal from differentiator I, provides double-differentiated needle pulses to integrator switch Q24, to quickly "dump" or discharge capacitor C23 between successive time intervals.

The operation of the improved apparatus, shown in FIG. 3, will now be described. Assume that all capacitors are initially charged. A start pulse supplied from the extruder will be double-differentiated by series-connected differentiators I and II, and the resultant needle pulse will quickly close switch Q24 to immediately dump capacitor C23. After this needle pulse has been applied, switch 24 again opens, and capacitor C23 is supplied with constant current from the negative source via resistor R22. Seeing this, the operational amplifier 21 attempts to produce an output signal, which will be applied through multiplier 6 and capacitor C23, to produce a zero voltage at its inverting inlet, like its grounded non-inverting inlet. Because the output of amplifier 21 becomes saturated, capacitor C23 acts as though it was being supplied with constant current. Therefore, capacitor C23 changes according to the following equation:

$$V_{C23} = \frac{i_{constant} \cdot t}{C_{23}} = Z \tag{5}$$

where $V_{C23}$ is the charge on the capacitor, $i_{constant}$ represents constant current, t is the time interval during which constant current is supplied, and C23 is the capacitance of capacitor C23. Hence, the charge on capacitor C23 will increase linearly as a function of time, and will reach a maximum value at the end of a time interval $t_a$, or:

$$Z_{max} = \frac{i_{constant} \cdot t_a}{C_{23}} = X_{max} \cdot Y \tag{6}$$

Solving for $X_{max}$:

$$X_{max} = \frac{i_{const} \cdot t_a}{C_{23} \cdot Y} \tag{7}$$

Since $i_{constant}$, C23 and Y are all constant during any time interval, $X_{max}$ increases linearly with time. The length of the time interval $t_a$ needed for the value of X to rise to its maximum value may be found by solving equation 7 for $t_a$:

$$t_a = \frac{X_{max} \cdot C_{23} \cdot Y}{i_{const}} \tag{8}$$

If $X_{max}$, C23 and $i_{const}$ are all constant values, it will be seen that the length of the time interval $t_a$ need to have X rise to $X_{max}$, will be proportional to the correction signal Y. If the length of time interval $t_a$ is known or measurable, then equation (8) can be solved for a finite value of Y, which will be constant during any given time interval. Since, $Z = XY$, the value of signal Z will be directly proportional to signal X during any given time interval.

The integrator output signal X is supplied to the inverting inlet of comparator amplifier 51. Assume that the desired maximum value of X is +10 volts. Resistors R53 and R54 are selected such that when X is +10 volts, the inverting inlet of amplifier 51 sees zero volts, the same potential as appears at its non-inverting inlet. If both inlets of comparator 51 are at the same level, then the output of comparator 51 will be zero. When the next successive pulse closes switch Q55, a zero correction signal will be transferred to the storage circuit. However, the value of Y will not be zero, because an external input signal is supplied through resistor R44. In this condition, the caparator indicates that the value of X equals the desired value, $X_{max}$, at the end of the time interval, and that no further correction is needed.

Assume now that the time interval is increased. Comparator 51 will now indicate that at the end of the increased time interval, the value of X exceeds $X_{max}$. Since a positive signal will appear at the inverting inlet of amplifier 51, a negative signal will be produced at the comparator's output signal. When the next pulse appears, switch Q55 will momentarily close to transfer this data to the storage circuit. A decreased value of Y will be stored in capacitor C41 and supplied to the multiplier. This will decrease the charge signal Z supplied to capacitor C23 to the next subsequent time interval, so that the slope of the ramp signal generated during the next subsequent time interval will be correspondingly reduced. The amount by which the slope of the ramp signal will be changed, is such that during following time intervals of equal length to said next subsequent time interval, X will rise equal $X_{max}$.

Conversely, if time interval $t_n$ is less than the previous time interval $t_{n-1}$, X will now rise to equal $X_{max}$ during such shortened time interval. Operational amplifier 51 will see a negative signal at its inverting inlet, and will produce a positive signal at its outlet. At the end of time interval $t_n$, the pulse from differentiator I will momentarily close switch Q55 to transfer an increased value of Y to the storage circuit. Such increased value of Y will increase the value of Z to increase the rate at which capacitor C23 changes during the next time interval. If the subsequent time intervals, $t_{n+1}, t_{n+2}, \ldots$, are all equal to the length of interval $t_n$, then the slope of the ramp signal will be adjusted as to equal $X_{max}$ at the end of these time intervals.

Therefore, the invention provides improved apparatus for generating a saw-tooth wave in which the slope of each ramp signal is adjusted to accommodate variations in the length of the time interval. Only one transitional time interval is needed to accommodate a change in time interval length.

The inlet signal need not necessarily be provided from extrusion apparatus, but may come from other sources as well. The pulses appearing in the inlet signal may, for example, reflect the revolutions of a shaft, or the operation of a knife or shear blade. Hence, the source of the inlet signal is not deemed to be critical.

While the preferred embodiment is shown as using an integrator as a ramp function generator, the invention contemplates that other type of ramp generators may be used, in which case the correction signal may modify the slope of the ramp signal after its formation. Therefore, while the preferred embodiment of the invention has been shown and described, persons skilled in this will recognize that various additional changes and variations may be made without departing from the spirit of the invention, as defined by the following claims.

What is claimed is:

1. A ramp generator for producing a self-adjusting saw-tooth wave in response to an input signal containing a plurality of successive start pulses separating time intervals of variable length, comprising:
   a first differentiator circuit arranged to receive said input signal and operative to supply a differentiated first output signal in response thereto;
   a second differentiator circuit arranged to receive said differentiated first output signal and operative to supply a double differentiated second output signal in response thereto;
   a ramp function generator supplied with said second output signal and operative to produce an output ramp signal in each of said time intervals; and
   correction means for varying the slope of the ramp signal produced in any one time interval in response to the length of said one time interval so that such modified-slope ramp signal will equal a predetermined maximum valve at the end of the next successive time interval, if said one and successive time intervals are of equal length; said correction means including a comparator circuit operatively arranged to continuously compare the value of said ramp signal with said predetermined maximum value and to supply a correction signal reflective of the difference therebetween, a storage circuit arranged to receive and store said correction signal and operative to supply said correction signal to said ramp function generator, and switch means interposed between said comparator and storage circuits and supplied with said first output signal and operative to transfer said correction signal to said storage circuit at the end of each time interval.

2. A ramp generator as set forth in claim 1 wherein said ramp function generator is an integrator.

3. A ramp generator as set forth in claim 1 wherein said switch means is operated by the start pulses in said input signal.

4. A ramp generator as set forth in claim 1 wherein said correction means further includes:
   a multiplier supplied with said ramp function generator output signal and with said correction signal, and operative to supply the product therebetween to said ramp function generator.

5. A ramp generator as set forth in claim 4 wherein said ramp function generator is an integrator.

* * * * *